(12) United States Patent
Fuerstenberg et al.

(10) Patent No.: US 7,829,786 B2
(45) Date of Patent: Nov. 9, 2010

(54) SEALING SYSTEM AND METHOD FOR SEALING A COMPONENT WITHIN AN ELECTRONIC DEVICE

(75) Inventors: Robert M. Fuerstenberg, Boca Raton, FL (US); Christopher D. Crawford, Hollywood, FL (US); Jorge L. Garcia, Plantation, FL (US); Jody H. Akens, Weston, FL (US); Salvador P. Magana, Wellington, FL (US)

(73) Assignee: Motorola, Inc., Schaumburg, IL (US)

( * ) Notice: Subject to any disclaimer, the term of this patent is extended or adjusted under 35 U.S.C. 154(b) by 564 days.

(21) Appl. No.: 11/856,866

(22) Filed: Sep. 18, 2007

(65) Prior Publication Data

US 2009/0071748 A1 Mar. 19, 2009

(51) Int. Cl.
*H05K 5/00* (2006.01)
(52) U.S. Cl. ............... 174/50; 174/539; 174/50.52; 174/564; 361/679.01; 361/752; 277/910; 277/921

(58) Field of Classification Search ............ 174/50, 174/53, 57, 58, 520, 17 R, 539, 554, 559, 174/560, 561, 564, 135, 50.52; 439/535, 439/949; 361/679.02, 679.01, 724, 730, 361/752, 796, 600, 601; 277/910, 917; 455/575.1, 455/73, 575.8
See application file for complete search history.

(56) References Cited

U.S. PATENT DOCUMENTS

| | | | | |
|---|---|---|---|---|
| 3,778,529 A * | 12/1973 | Miller | ...................... | 174/528 |
| 5,703,754 A * | 12/1997 | Hinze | ...................... | 174/564 |
| 6,847,806 B2 * | 1/2005 | Curtis et al. | ............... | 455/575.1 |
| 7,210,963 B2 * | 5/2007 | Chintala et al. | ........ | 361/679.01 |
| 7,563,992 B2 * | 7/2009 | Lawlyes et al. | ............ | 174/564 |
| 7,626,129 B2 * | 12/2009 | Sasaki et al. | ............... | 174/520 |
| 7,652,892 B2 * | 1/2010 | Shiu et al. | .................. | 361/752 |

* cited by examiner

*Primary Examiner*—Angel R Estrada
(74) *Attorney, Agent, or Firm*—Randi L. Karpinia; Anthony P. Curtis

(57) ABSTRACT

A sealing system for sealing a component (102) within an electronic device (100) is provided. The system includes one or more apertures (206) within an internal housing (202). Further the system includes an adhesive (602), adhered on a first surface to a ledge (502) and bottom perimeter surface 402 of the component. Furthermore, the system includes an external housing (204). The external housing presses the perimeter of the component onto the ledge.

20 Claims, 11 Drawing Sheets

SEALING SYSTEM AND METHOD FOR SEALING A COMPONENT WITHIN AN ELECTRONIC DEVICE

FIELD OF THE INVENTION

The present invention generally relates to the field of electronics. More specifically, the present invention relates to a sealing system for components within an electronic device.

BACKGROUND

Electronic devices are found in every aspect of one's life in today's world. Small, portable electronic devices, such as, two-way radios, mobile telephones, personal digital assistants (PDAs), laptop computers, and music players have become a major part of many people's lives.

Many electronic devices today include a connector terminal. The connector terminal enables connection of the electronic device to various accessories. The connector terminal, for example, can be a port for charging the electronic device, or an audio and/or video input/output of data from the electronic device such as connection point for microphones and the like. The connector terminal can also be used for a combination of two or more operations, such as the simultaneous transfer of data and charging of the electronic device. In general the connector terminal is assembled with the housing of the electronic device. In applications requiring water immersion the connector terminal is often assembled with the electronic device by ultrasonic welding. However, the welding does not provide a sealed joint between the connector terminal and the housing of the electronic device. When welding joints are utilized, an additional sealing method such as one or more gaskets may be incorporated. Further, for this kind of assembly to be firm and reliable, the material of the connector terminal and the housing of the electronic device need to be of the same material. Moreover, the process of welding the connector terminal to the electronic device can be costly.

Many electronic devices incorporate at least one lens. The lens is utilized to protect other elements of the electronic device, such as a display panel. The lens forms an outer protective covering of various other elements of the electronic device such as, an aperture for Light Emitting Diodes (LED) on top surface of the electronic device. In general the lens is press fitted with the electronic device. However, such an assembly is typically not water proof.

BRIEF DESCRIPTION OF THE FIGURES

The accompanying figures, where like reference numerals refer to identical or functionally similar elements throughout the separate views, and which, together with the detailed description below, are incorporated in and form part of the specification, serve to further illustrate various embodiments and explain various principles and advantages, all in accordance with the present invention.

Figure 1:
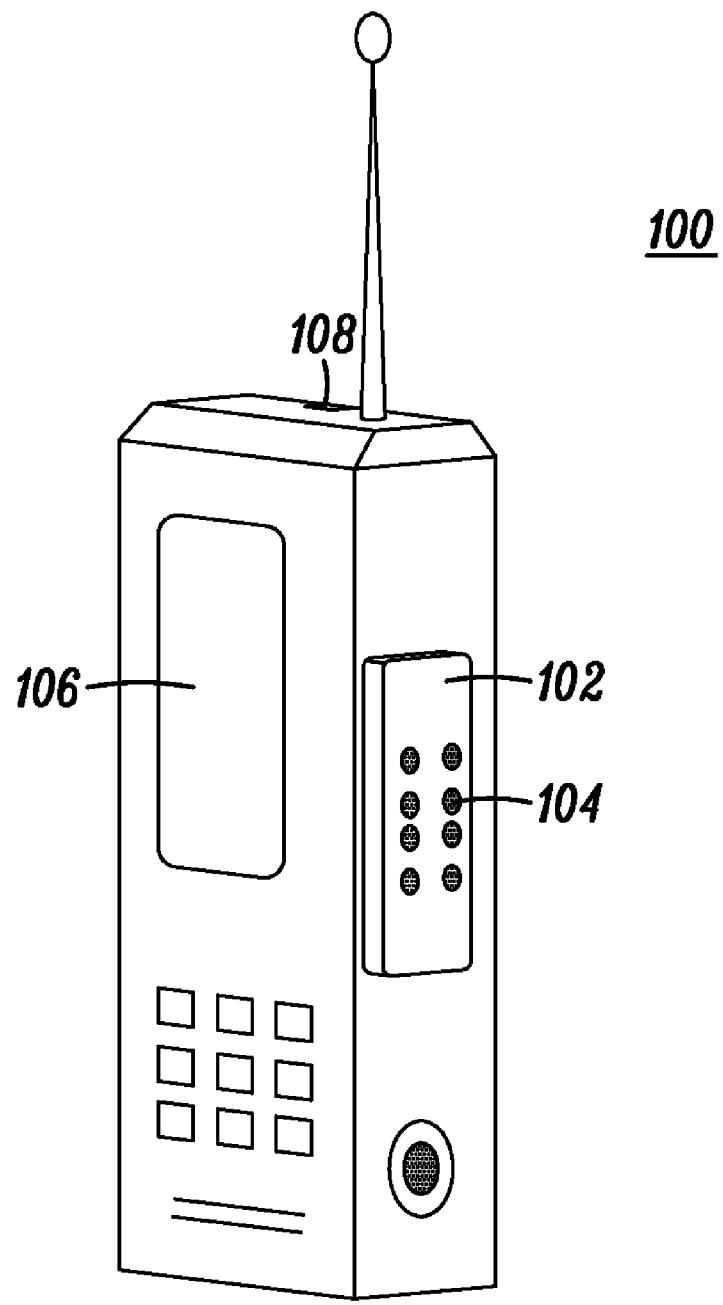
FIG. 1 illustrates an electronic device, where various embodiments of the present invention can be practiced.

Skilled artisans will appreciate that elements in the figures are illustrated for simplicity and clarity and have not necessarily been drawn to scale. For example, the dimensions of some of the elements in the figures may be exaggerated, relative to other elements, to help to in improving an understanding of the embodiments of the present invention.

DETAILED DESCRIPTION

Before describing in detail the particular system and method for sealing a component within an electronic device, in accordance with various embodiments of the present invention, it should be observed that the present invention resides primarily in combinations of method steps related to a system and method for sealing a component within an electronic device. Accordingly, the system components and method steps have been represented, where appropriate, by conventional symbols in the drawings, showing only those specific details that are pertinent for an understanding of the present invention, so as not to obscure the disclosure with details that will be readily apparent to those with ordinary skill in the art, having the benefit of the description herein.

In this document, the terms "comprises," "comprising", or any other variation thereof, are intended to cover a non-exclusive inclusion, such that a process, method, article or apparatus that comprises a list of elements does not include only those elements but may include other elements that are not expressly listed or inherent in such a process, method, article or apparatus. An element proceeded by "comprises . . . a" does not, without more constraints, preclude the existence of additional identical elements in the process, method, article or apparatus that comprises the element. The term "another," as used in this document, is defined as at least a second or more. The terms "includes" and/or "having", as used herein, are defined as comprising.

In the description herein, numerous specific examples are given to provide a thorough understanding of various embodiments of the invention. The examples are included for illustrative purpose only and are not intended to be exhaustive or to limit the invention in any way. It should be noted that various equivalent modifications are possible within the spirit and scope of the present invention. One skilled in the relevant art will recognize, however, that an embodiment of the invention can be practiced with or without the apparatuses, systems, assemblies, methods, components mentioned in the description.

For one embodiment, a sealing system is provided for sealing a component within an electronic device. The sealing system includes one or more apertures within an internal housing. Further, the sealing system includes an adhesive adhered on a first surface to a ledge of the one or more apertures and adhered on a second surface to a perimeter of the component. Furthermore, the sealing system includes an external housing. The external housing presses the perimeter of the component onto the ledge of the one or more apertures.

For another embodiment, a method for sealing a component within an electronic device is provided. The method includes adhering an adhesive on a first adhesive surface to a ledge of one or more apertures. The one or more apertures are within an internal housing. The internal housing is otherwise sealed. The method also includes adhering the adhesive on a second adhesive surface to a perimeter of the component. Further, the method includes pressing the perimeter of the component onto the ledge of one or more apertures using an external housing.

FIG. 1 illustrates an electronic device 100, where various embodiments of the present invention can be practiced. Examples of the electronic device 100 may include a two-way radio, a Personal Digital Assistant (PDA), a laptop computer, a messaging device, a mobile telephone, a music player, and the like. The electronic device 100 is depicted as a two-way radio in FIG. 1, for illustration purposes only. The electronic device 100 includes a component 102. The component 102 in the illustrated embodiment is a connector terminal or a connection port. The component 102 can be a jack and pin arrangement, enabling the electronic device 100 to connect with another device. For example, the component 102 can be a connector terminal for attaching a remote microphone of a two-way radio. In one embodiment, the component 102 can be a port for charging the electronic device 100. For example, the component 102 can also be used to charge a remote microphone. The component 102 enables the connection of the electronic device 100 through one or more contact points 104. The one or more contact points 104 of the component 102 can also be used for one or more functions. For example, the component 102 can be used to transfer data to and from the electronic device 100. In other words a communication link can be established between the electronic device 100 and another device through the one or more contact points 104 of the component 102. In one embodiment the component 102 can also enable charging of the electronic device 100 and simultaneously transfer of data.

The component 102 is assembled within the electronic device 100 in such a manner that the component 102 is attached to form a sealed assembly between the component 102 and the electronic device 100. The component 102 is sealed within the electronic device 100 to form an integral assembly with the internal housing of the electronic device 100. This is further described hereinafter in conjunction with FIGS. 5 & 6.

In another embodiment, the component 102 can comprise a display lens 106. The display lens 106, for example, can provide a protective covering for the display panel of the electronic device 100. The display lens 106 can be a clear lens for viewing another element beneath it such as the display panel of the electronic device 100. The display lens 106 can be a stamped lens made of clear glass, clear plastic poly carbonate, or an equivalent. In another embodiment the component 102 can comprise a lens 108 of the electronic device 100. The lens 108 can provide a protective transparent window for any visual indictor such as a Light Emitting Diode (LED) of the electronic device 100. The lens 108 can also provide a protective transparent window for an electromagnetic wave receiver for communication with one or more other devices. For example, the lens 108 can provide a protective covering for an Infra Red (IR) receiver. The lens 108 is typically made of polycarbonate, clear glass, clear plastic, or an equivalent. It will be appreciated by those of ordinary skill in the art that the electronic device 100 can include one or more lens such as the described display lens 106 and lens 108.

Figure 2:
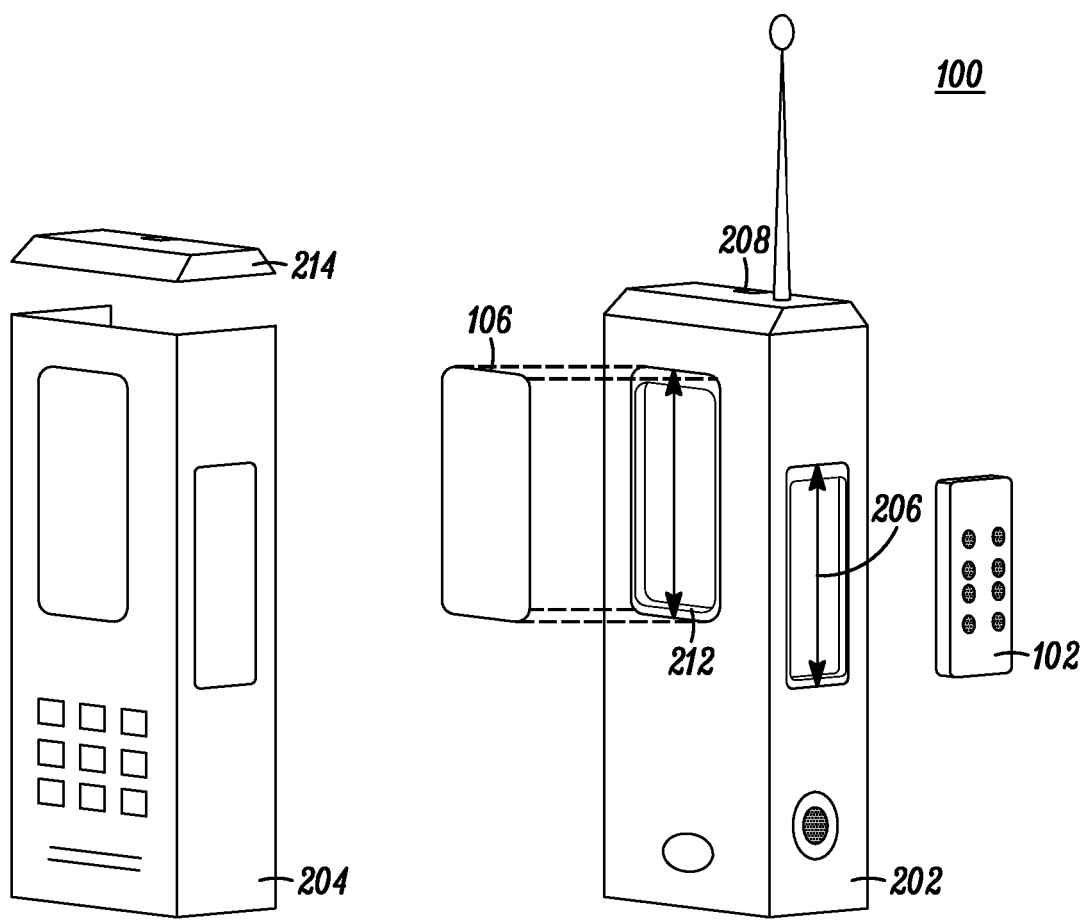
FIG. 2 is an exploded view of an internal chassis and external housing of the electronic device in accordance with an embodiment of the present invention.

FIG. 2 is an exploded view of an internal chassis and external housing of the electronic device 100 in accordance with an embodiment of the present invention. The body of the electronic device 100 is primarily made of an internal chassis or internal housing 202 and a skin or an external housing 204. The internal housing 202 is a sealed covering for the electronic components such as printed circuit boards and a microprocessor of the electronic device 100. The internal housing 202 can be a base chassis made of a hard plastic molded in the required shape. The internal housing 202 can also be made of metal. The internal housing 202 includes one or more cavities or one or more apertures. For example, the internal housing 202 has an aperture 206. The aperture 206 is formed such that the component 102 can fit within it. The internal housing 202 can also include another aperture 208 on its top surface. The aperture 208, for example, can have an LED located within it. The internal housing 202 can also have various components mounted on it. For example, the internal housing 202 includes a display panel 210 mounted on it. The display panel 210 can be fixed with an adhesive or any permanent or temporary fastener in the aperture 212. In one embodiment, the display panel 210 is an LCD panel of the electronic device 100.

The external housing 204 forms a protective covering over the internal housing 202. The external housing 204 is an outer cover. The external housing 204 encapsulates the internal housing 202. The external housing 204 aids in keeping components such as a keypad intact. The external housing 204 can be made of plastic, metal, or any other equivalent material. In general the external housing 204 is press fitted onto the internal housing 202, however it is apparent to a person ordinarily skilled in the art, that the external housing 204 can be fitted on the internal housing 202 by any permanent or temporary fastening means. Further there can be a top cover 214 for the internal housing 202. The top external housing 214 acts as an external cover for the top surface of the internal housing 202, similar to the external housing 204. The top cover can be of the same or different material form the external housing 204. In another embodiment, the top external housing 214 and the external housing 204 are a single external housing.

Figure 3:
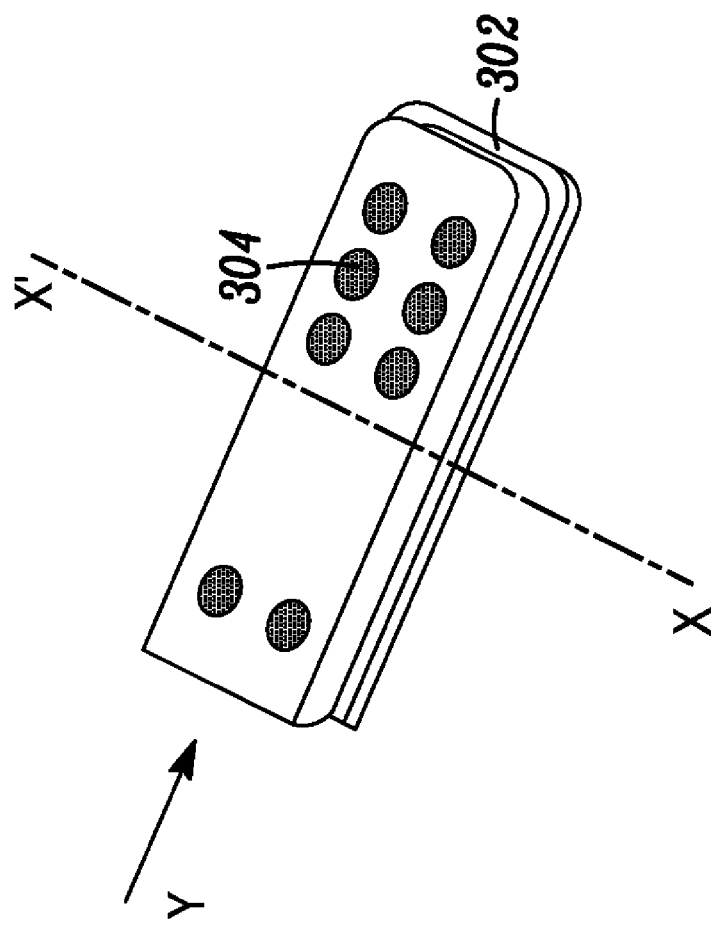
FIG. 3 illustrates a three-dimensional view of a component, in accordance with an embodiment of the present invention.

FIG. 3 illustrates a three-dimensional view of the component 102, in accordance with an embodiment of the present invention. The component 102 is sectioned along the axis XX'. The sectional view is viewed from Y as shown in FIG. 3. The sectional view is further described in FIG. 4. In an embodiment, the component 102 can be a connector terminal. The component 102 has an extended portion 302. The extended portion 302 runs along the perimeter of the component. The extended portion 302 along the perimeter can be interchangeably referred to as rim 302 for the sake of clarity. The rim 302 enables the component 102 to rest on the one or more apertures 206 of the internal housing 202 of the electronic device 100.

The component 102 includes one or more contact points 304. The one or more contact points 304 are arranged within one or more openings of the component 102. The one or more contact points 304, for example, can be used to provide electrical connections. The one or more contact points 304 provide electrical connection between the electronic device 100 and another electronic device attached through the component 102. The component 102 is formed by encapsulating the one or more contact points 304 in a high temperature material. In one embodiment, the high temperature material can be high temperature plastic. In another embodiment, the component 102 can include spring loaded contact points encapsulated in the high pressure material.

The component 102 can be used for different functions for example, it can act as a port for charging the electronic device 100. In an embodiment, the component 102 can be used for the transfer of data. In this embodiment the component 102 can act a connection port for another electronic device, for example, a microphone. In other words the component 102 acts a connecting link between the microphone and the electronic device 100 to enable transmitting and receiving data. The component 102 can also be used for a combination of two or more functions, such as simultaneous charging of the electronic device 100 and the transfer of data.

Figure 4:
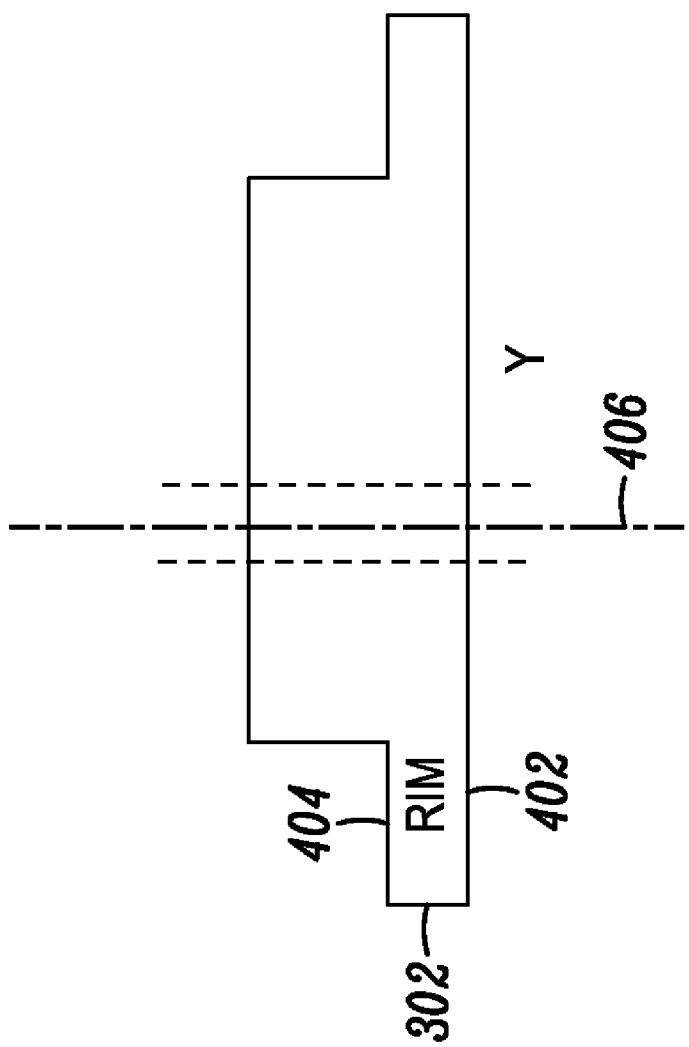
FIG. 4 illustrates a sectional view of a component, in accordance with an embodiment of the present invention.

FIG. 4 illustrates a sectional view of the component 102, in accordance with an embodiment of the present invention. The component 102 is sectioned along the axis XX' as shown in FIG. 3. In one embodiment, a bottom perimeter surface 402 of the rim 302 can be coated with an adhesive. The bottom perimeter surface 402 of the rim 302 is located over the one or more apertures 206 of the internal housing 202 to form an assembly of the component 102 and the electronic device 100. Further, the rim 302 includes a top perimeter surface 404. The component 102 includes one or more openings 406. The one or more opening 406 is the through hole such that the one or more contact points 304 can be located inside. This is further described hereinafter in conjunction with FIGS. 6 & 7.

Figure 5:
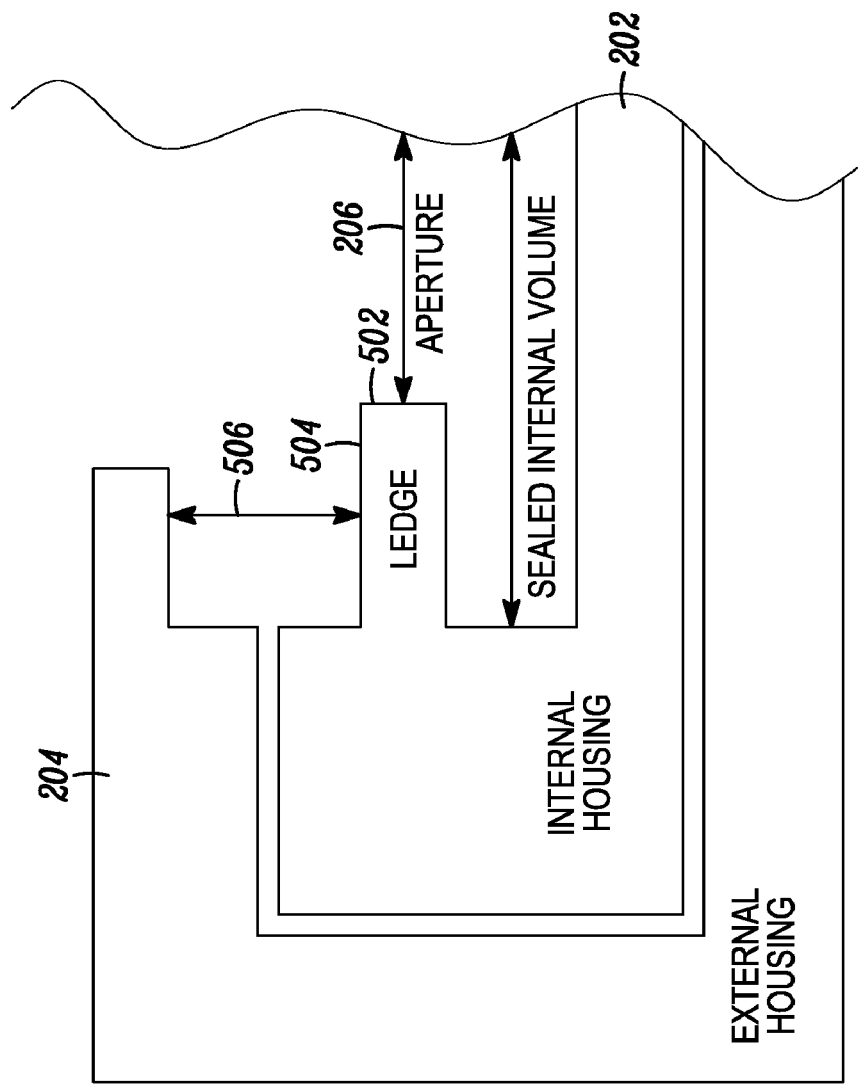
FIG. 5 illustrates a portion of the electronic device, in accordance with an embodiment of the present invention.

FIG. 5 illustrates the electronic device 100, in accordance with an embodiment of the present invention. The electronic device 100 includes the internal housing 202, an external housing 204 and one or more apertures 206. In one embodiment, the external housing 204 can be a sealed covering for the electronic device 100. In another embodiment, the external housing 204 is not sealed over the electronic device 100. However, the internal housing 202 is sealed covering for the internal components such as a microprocessor or printed circuit boards of the electronic device 100. The internal housing 202 can be made of hard plastic, metal casting or a similar material. The internal housing 202 has one or more apertures 206. The one or more apertures 206 can be a cavity in such a manner that the component 102 can be located in alignment with the one or more apertures 206. The internal housing 202 has a ledge 502, protruding from the one or more apertures 206. The ledge 502 acts as a supporting rest for the rim 302 of the component 102. For example, as shown in FIG. 5 the ledge 502 protrudes perpendicular to the depth of the one or more apertures 206. The ledge 502 has an upper perimeter surface 504. The bottom perimeter surface 402 of the rim 302 can be placed over the upper perimeter surface 504 of the ledge 502 in such a manner that the component 102 fits inside the one or more apertures 206. The rim 302 of the component 102 is located inside the area 506. The external housing 204 also exerts a load on the top perimeter surface 404 in such a manner that the rim 302 of the component 102 remains intact on the ledge 502 of the internal housing 202. This is further described hereinafter in conjunction with FIGS. 6 & 7.

Figure 6:
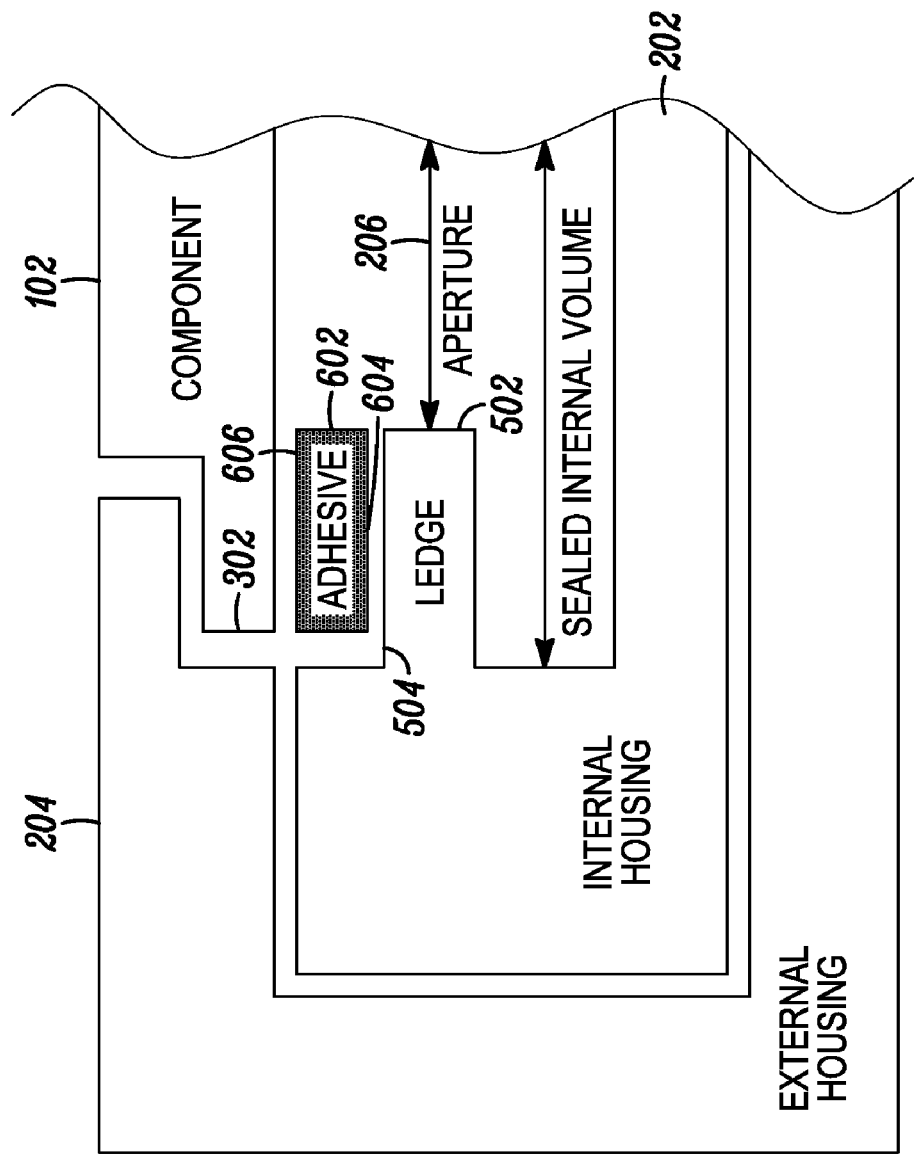
FIG. 6 illustrates an assembly of the electronic device and the component, sealed within the electronic device.

FIG. 6 illustrates an assembly of the component 102 sealed within the electronic device 100, in accordance with an embodiment of the present invention. The assembly includes an adhesive 602 in addition to the component 102, the internal housing 202, and the external housing 204. The adhesive 602 is used for sealing the component 102 within the electronic device 100. The adhesive 602 has a first adhesive surface 604 and a second adhesive surface 606. The first adhesive surface 604 is placed over the upper perimeter surface 504 of the ledge 502. The second adhesive surface 606 faces the rim 302 of the component 102. The adhesive 602 is located between the bottom perimeter surface 402 of the rim 302 and the internal housing 202. In other words, the adhesive 602 is located below the rim 302 and over the upper perimeter surface 504 of the ledge 502, so as to form a sealing system along the perimeter of the ledge 502 and the rim 302. The adhesive 602 seals the component 102 within the internal housing 202.

The external housing 204 encapsulates the internal housing 202 along with the component 102. Further, the external housing 204 puts a load on the top perimeter surface 404 of the rim 302. The load applied by the external housing 204 enables the component 102 to firmly rest on the ledge 502 of the internal housing 202. The external housing 204 applies the load along the perimeter of the component 102.

The adhesive 602 along with the pressing load by the external housing 204 on the component 102 provides an efficient sealing system for the component 102 within the electronic device 100.

In one embodiment, the adhesive 602 is a Very High Bond (VHB) adhesive. It will be appreciated by those of ordinary skill in the art that the adhesive 602 can be any adhesive capable of functioning in normal working conditions and in one embodiment the adhesive 602 capable of functioning in sub-zero degree temperatures. In one embodiment a separate adhesive can be applied on at least one of the bottom perimeter surface 402 of the rim 302 and the upper perimeter surface 504 of the ledge 502.

Figure 7:
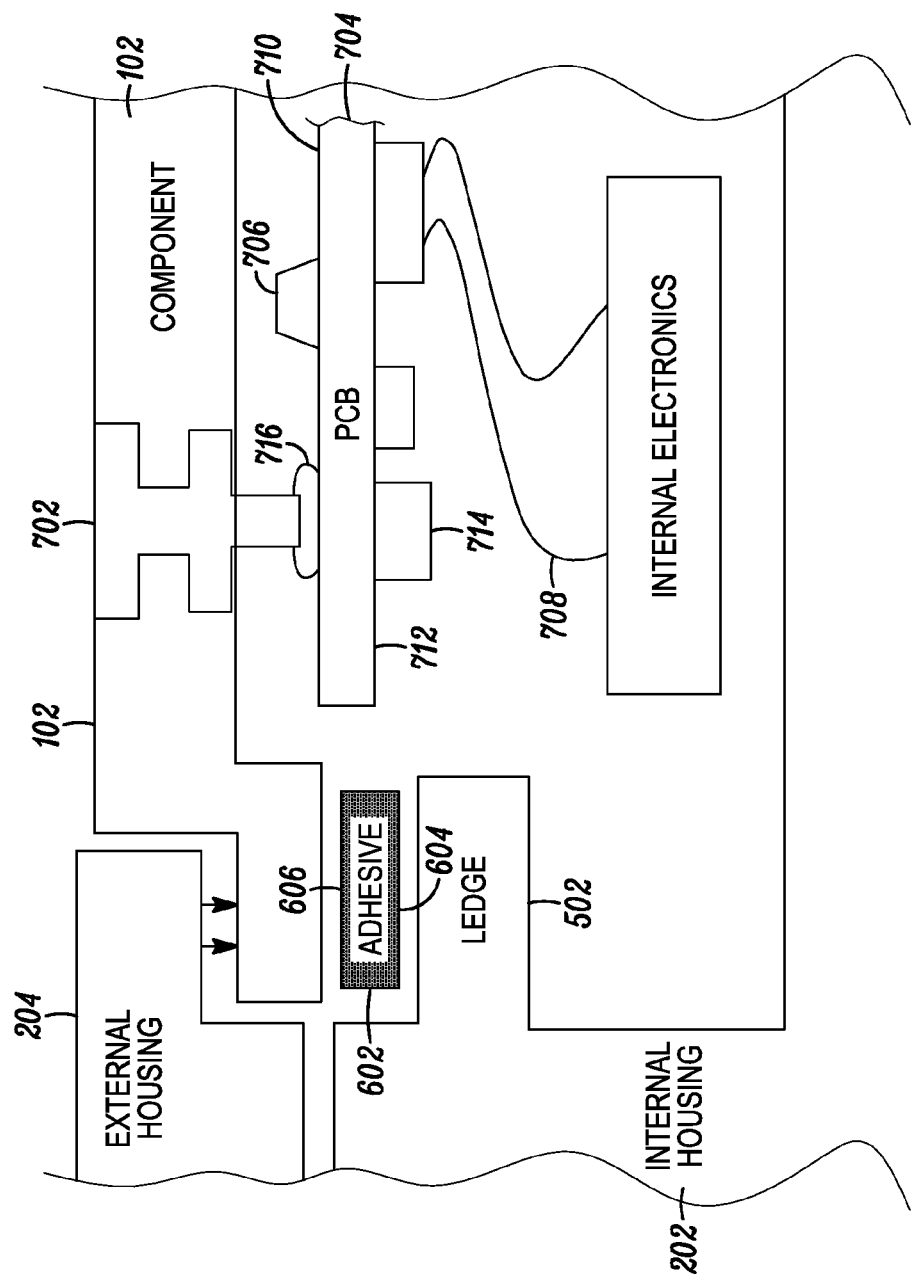
FIG. 7 illustrates the component sealed within the electronic device, in accordance with an embodiment of the present invention.

FIG. 7 illustrates the component 102 sealed within the electronic device 100, in accordance with an embodiment of the present invention. The assembly includes one or more contact points 702, a Printed Circuit Board (PCB) 704, one or more solder balls 706, and a connector 708. In addition, FIG. 7 includes the internal housing 202, the external housing 204, and the adhesive 602. The first adhesive surface 604 of the adhesive 602 is pasted onto the upper perimeter surface 504 the ledge 502. The second adhesive surface 606 of the adhesive 602 is pasted onto the bottom perimeter surface 402 of the rim 302. The adhesive 602 forms a sealing system for the electronic device 100. The external housing 204 presses the top perimeter surface 404 of the rim 302. The load from the external housing 204 presses the component 102 onto the ledge 502 of the internal housing 202.

In one embodiment the component 102 can be an electrical connector. The electrical connector includes one or more contact points 702. The one or more contact points 702 function as the electrical connections of the component 102. The one or more contact points 702 arranged within one or more opening 406 of the electrical connector. The electrical connector is formed from a high temperature plastic encapsulating the one or more contact points 702. The one or more contact points 702 are made of an electrical conducting material. The one or more contact points 702 form an electrical connection with the PCB 704. The one or more contact points 702 have one end open on the upper surface of the component 102. The other end of the one or more contact points 702 is connected to the PCB 704. The one or more contact points 702 are coupled to the PCB 704 using high temperature solder connections. The solder connections are formed by one or more solder balls 706. The one or more solder balls 706 form an electrical connection with the connector 708. In one embodiment the connector 708 is a wired connection of the internal circuitry of the electronic device 100 with the contact points 702. This connection is through the PCB 704. In other words, the one or more contact points 702 are connected with the PCB 704 through the one or more solder balls 706. Further, the PCB 704 is connected with the internal circuitry of the electronic device 100 through the connector 708.

The PCB 704 has a first printed circuit board surface 710 on the upper side facing the component 102. The PCB 704 has a second printed circuit board surface 712. The second printed circuit board surface 712 is on the opposite side of the first printed circuit board surface 710. The first printed circuit board surface 710 has the one or more solder balls 706. The one or more solder balls 706 are arranged in alignment with the one or more contact points 702. In other words, the one or more solder balls 706 are arranged in a pattern similar to that of the one or more contact points 702, such that an electrical connection is established, when the component 102 is placed in the one or more apertures 206. The second printed circuit board surface 712 has the one or more connector 708 and a plurality of components 714. The plurality of components 714 are electrically connected on the second printed circuit board surface 712. The plurality of the components 714 aid in functioning of the electrical connector. The connector 708 on the second printed circuit board surface 712 connects the PCB 704 with the internal circuitry of the electronic device 100.

In one embodiment, the one or more connector 708 connects the plurality of components 714 is to internal electronics of the electronic device 100. In another embodiment, the plurality of components 714 can be an internal layout for the PCB 704. In yet another embodiment, the plurality of components 714 can be the internal layout for the PCB 704 and also connect the component 102 to the internal electronics of the electronic device 100.

The assembly also includes the external housing 204. The external housing 204 can be a protective covering over the internal housing 202. The external housing 204 can also exert a load in such a manner that the rim 302 of the component 102 remains intact on the ledge 502 of the internal housing 202. The external housing 204 covers the internal housing 202 and the component 102. The external housing 204 comes over the top of the internal housing 202 and the component 102. The circumference of the external housing 204 exerts a continuous pressure over the component 102. The continuous pressure over the component 102 enables the component 102 to remain intact on the ledge 502 of the internal housing 202. The continuous load on the top perimeter surface 404 of the rim 302 and keeps the component 102 adhered to the upper perimeter surface 504 of the ledge 502.

Figure 8:
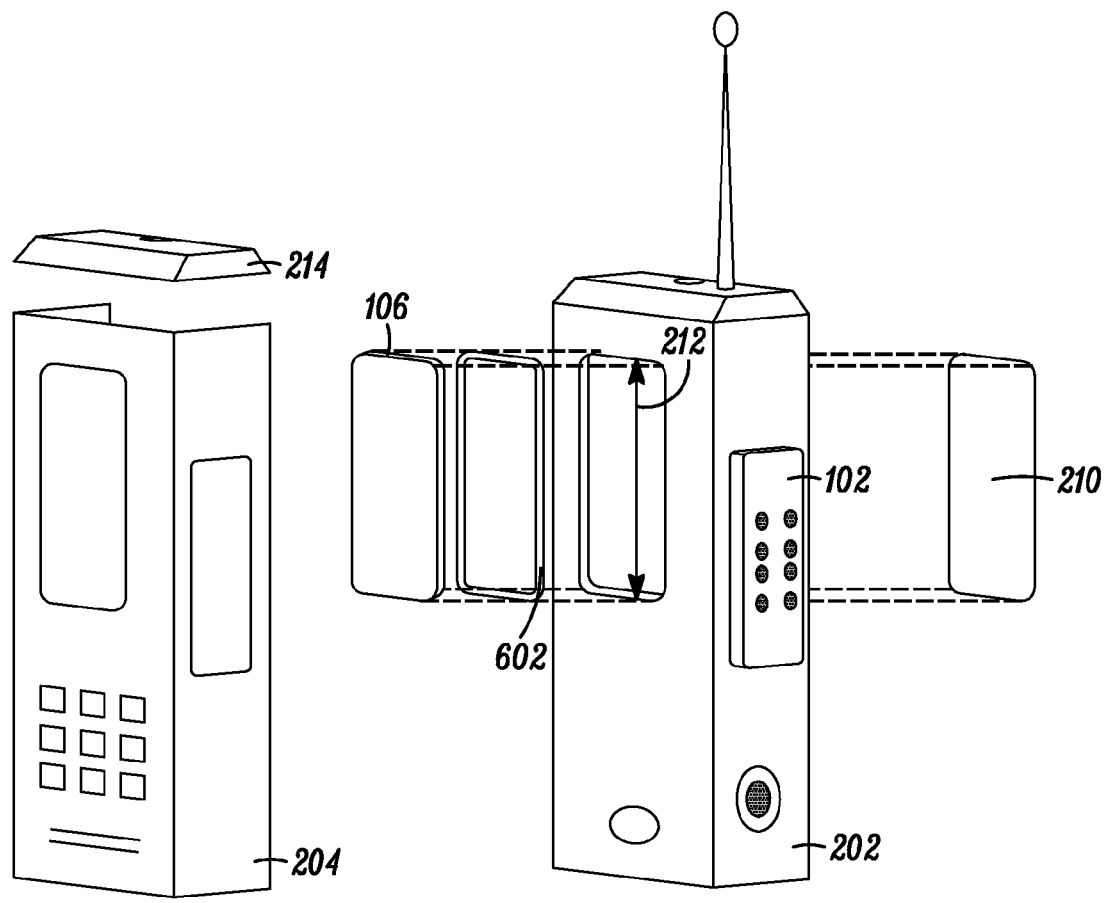
FIG. 8 is an exploded view of an internal housing, a external housing and a lens in accordance with an embodiment of the present invention.

FIG. 8 is an exploded view of the internal housing 202, the external housing 204 and the display lens 106 in accordance with an embodiment of the present invention. The exploded view includes the adhesive 602, and a display panel 210 internal housing 202 has the display panel 210 mounted inside the aperture 212. The adhesive 602 is located over the perimeter of the display panel 210. Further, the display lens 106 is positioned over the adhesive 602, and thereafter the external housing 204 is fitted over the internal housing 202. The assembly is similar to the sealing system as described hereinbefore for FIGS. 6 and 7. The display lens 106 can act as the component 102. The aperture 212 acts as the one or more apertures 206. The display lens 106 adheres to the internal housing 202 using the adhesive 602. Different grades of adhesive 602 can be used in assembly of electronic device 100. Further the adhesive 602 used for sealing the display lens 106 can be different form the adhesive used for sealing the component 102. The external housing 204 puts a load on the outer surface of the display lens 106. The load applied by the external housing 204 enables the display lens 106 to firmly rest on the internal housing 202.

In one embodiment, the display lens 106 can be made of a clear glass lens. In another embodiment, the display lens 106 can be made of polycarbonate or a clear plastic lens. The display lens 106 provides a protective covering for a display panel 210 of the electronic device 100. The display lens 106 is a clear lens for viewing the display panel 210 of the electronic device 100.

Figure 9:
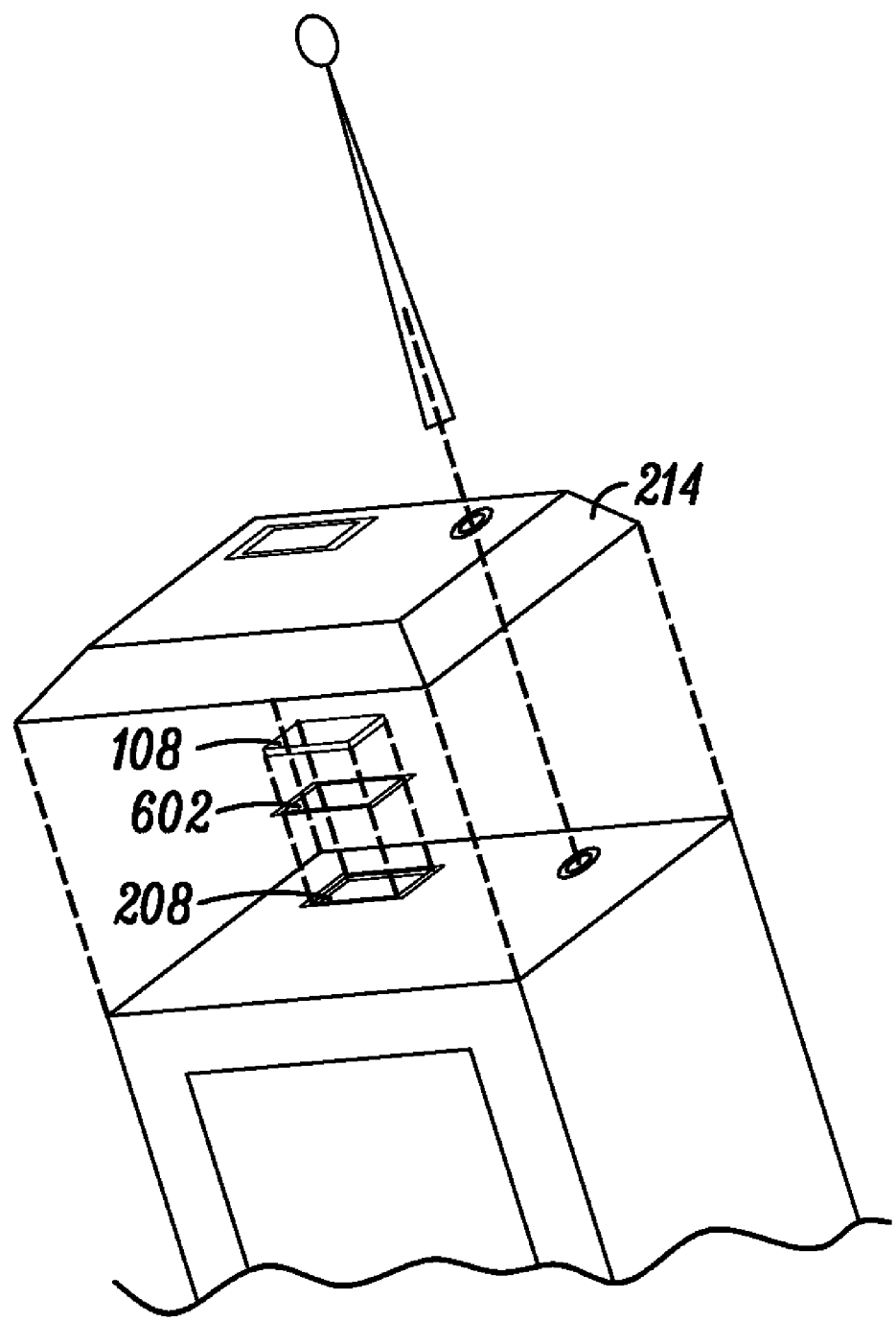
FIG. 9 is an exploded view of an internal housing and a top control assembly in accordance with an embodiment of the present invention.

FIG. 9 is an exploded view of an internal housing 202 and a top control assembly of the electronic device 100 in accordance with an embodiment of the present invention. The top control assembly has a top external housing 214, the lens 108, the adhesive 602 and other electronic circuitry such as antenna and the like. The internal housing 202 includes an aperture 208 that accepts the lens 108. The lens 108 can act as the component 102. The aperture 208 acts as the one or more apertures 206. The lens 108 forms a transparent window for any visual indictor such as a Light Emitting Diode (LED). For example, the lens 108 can be a cover for a light indicator defining the charge status of the electronic device 100. The assembly is similar to the sealing system as described previously herein for FIGS. 6 and 7.

The lens 108 adheres to the internal housing 202 using the adhesive 602. The top external housing 214 puts a load on the top surface of the lens 108. The load applied by the top external housing 214 enables the lens 108 to firmly rest on the internal housing 202. The top external housing 214 applies load along the perimeter of the lens 108.

The adhesive 602 along with the pressing load by the top external housing 214 on the lens 108 provides an efficient sealing system for the lens 108 within the electronic device 100.

In one embodiment, the top external housing 214 can be a part of the external housing 204. In other words, the top external housing 214 and the external housing 204 is the outer covering that envelops the electronic device 100. In one embodiment, the lens 108 can be made of a clear glass lens or a clear plastic lens. In another embodiment, the lens 108 can be made of a polycarbonate. In an embodiment, the adhesive 602 is a Very High Bond (VHB) adhesive. It will be appreciated by those of ordinary skill in the art that the adhesive 602 can be any adhesive capable of functioning in normal working conditions and in one embodiment in sub-zero degree temperatures. At extreme cold temperatures, the top external housing 214 will prevent the lens from un-attaching due to adhesive failure.

Figure 10:
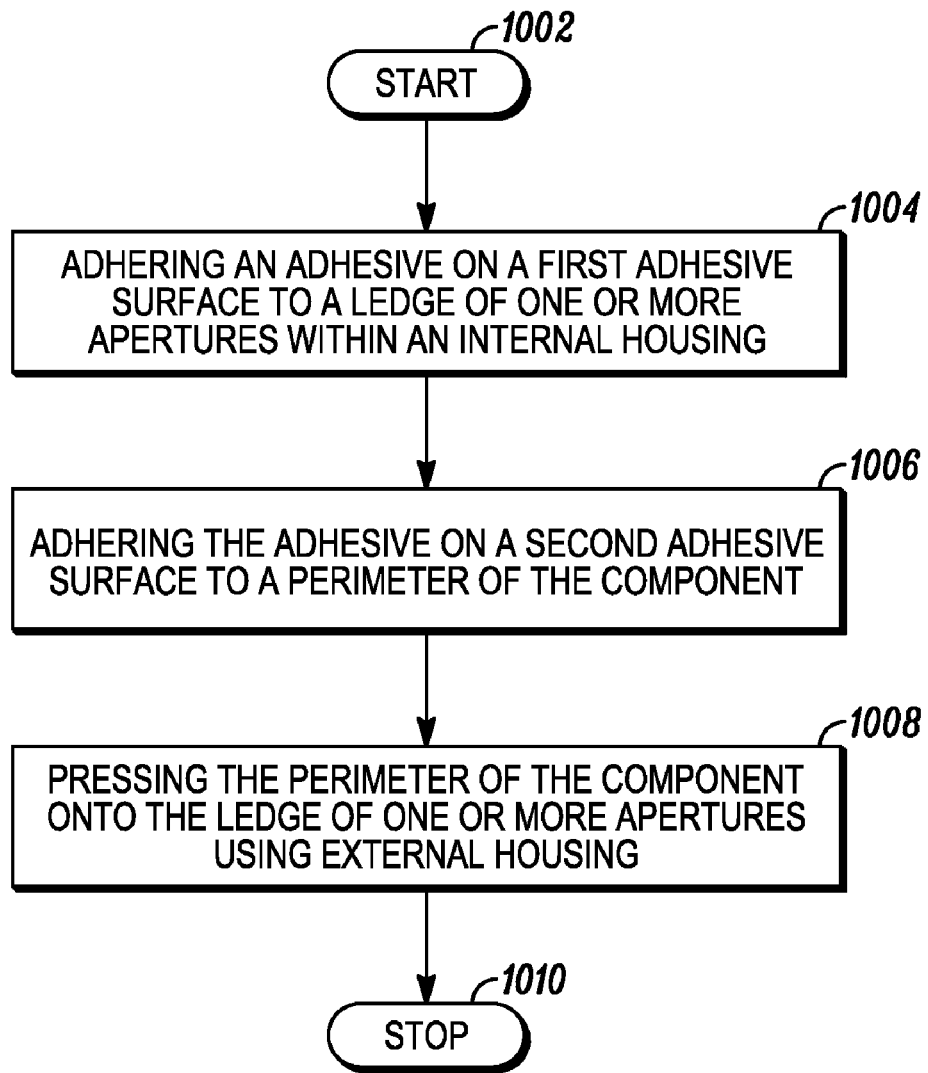
FIG. 10 is a flow diagram illustrating a method for sealing a component within an electronic device, in accordance with an embodiment of the present invention.

FIG. 10 is a flow diagram illustrating a method for sealing the component 102 with the electronic device 100, in accordance with an embodiment of the present invention. The method is initiated at step 1002. At step 1004, adhesive on the first adhesive surface 604 of the adhesive 602 is adhered on the upper perimeter surface 504 of the ledge 502. The ledge 502 protrudes perpendicular to the one or more apertures 206. The one or more apertures 206 are within the internal housing 202 which is otherwise sealed.

At step 1006, the second adhesive surface 606 of the adhesive 602 is adhered on to the bottom perimeter surface 402 of the rim 302 of the component 102. At step 1008, the top perimeter surface 404 of the component 102 is pressed onto the ledge 502 using the external housing 204. The external housing 204 encapsulates the internal housing 202. The external housing 204 forms a cover over the internal housing 202 and the component 102. The circumference of the external housing 204 exerts a continuous pressure over the component 102. The continuous load from the external housing 204 hold the component 102 adhered onto the upper perimeter surface 504 of the ledge 502. The external housing 204 ensures that the adhesive 602 retains its adhesiveness by pressing the rim 302 onto the ledge 502. Thereafter, the method terminates at step 1010.

Figure 11:
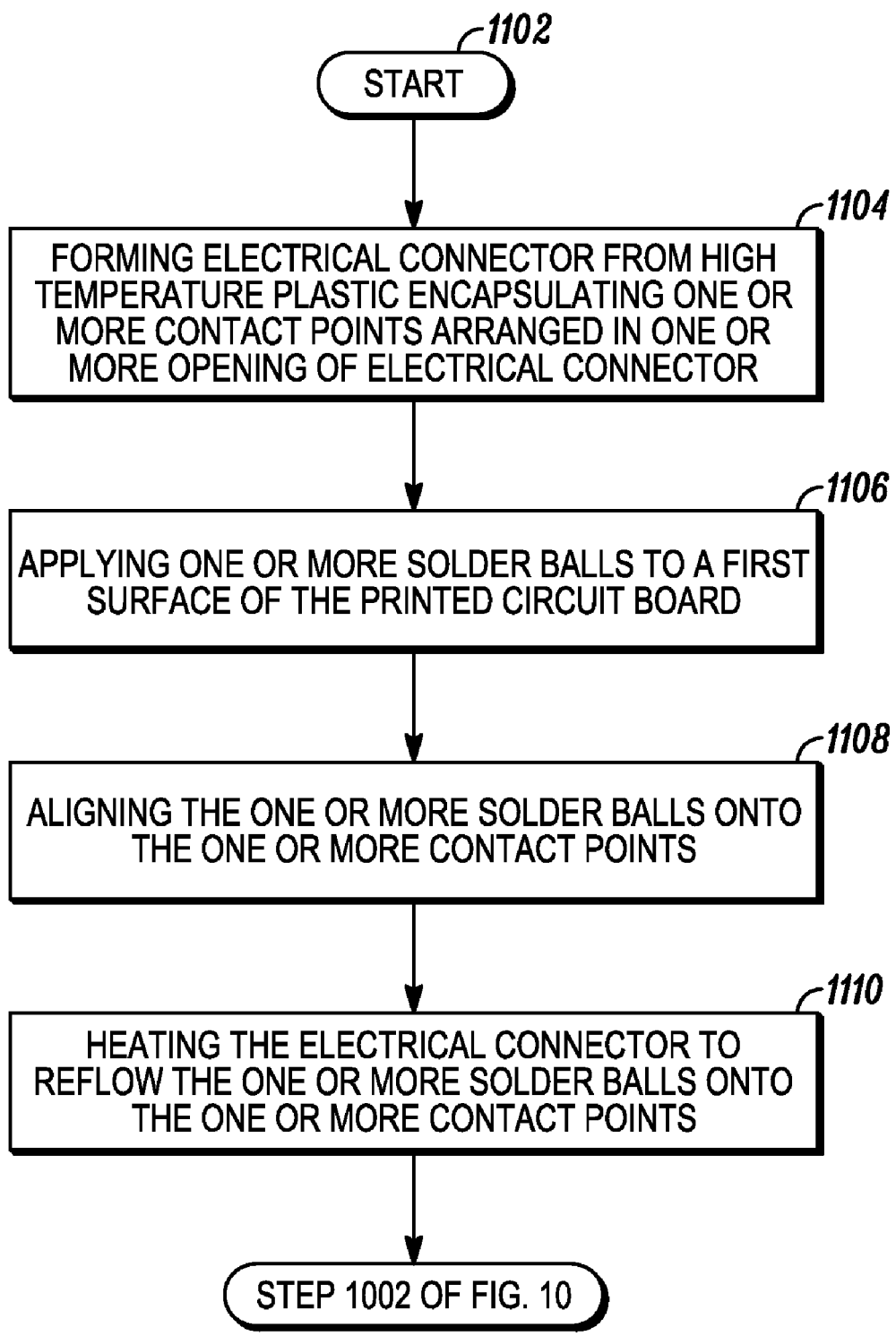
FIG. 11 is a flow diagram illustrating a method for sealing a component within an electronic device, in accordance with an embodiment of the present invention.

FIG. 11 is a flow diagram illustrating a method for sealing the component 102 with an electronic device 100, in accordance with an embodiment of the present invention. The method is described hereinbefore with reference to FIGS. 5 and 6. The method initiates at step 1102. At step 1104, an electrical connector of the component 102 is formed from a high temperature plastic material. The electrical connector is formed by arranging one or more contact points 702 in the one or more opening 406 in the component 102. In one embodiment the one or more contact points 702 are embedded in the molten plastic at high pressure. Thereafter, the plastic is allowed to cool thereby forming an integral structure of the one or more contact points 702 arranged in the electrical connector. The electrical connector of the component 102 is formed such that it encapsulates the one or more contact points 702. The one or more contact points 702 are arranged within one or more openings of the electrical connector of the component 102.

At step 1106, the one or more solder balls 706 are applied to the first printed circuit board surface 710 of the PCB 704. The one or more solder balls 706 provide connectivity to the component 102 through the electrical connector. The one or more solder balls 706 connect the circuits of the PCB 704 to the one or more contact points 702 of the electrical connector. The one or more solder balls 706 are thick balls of the soldering material, which enable connectivity to the circuit of the PCB 704.

At step 1108, one or more solder balls 706 are aligned in accordance with the one or more contact points 702. The one or more solder balls 706 are aligned on to the contact points so that an electrical connectivity can be established. At step 1110, the electrical connector is heated to couple the one or more contact points 702 to the PCB 704 using high temperature solder connections. The electrical connector is heated in such a way that the one or more solder balls 706 flow onto the corresponding one or more contact points 702. Heating the electrical connector melts the one or more solder balls. The one or more solder balls 706 are made to reflow onto the one or more contact points 702. The reflowed solder balls 716 form a conducting connection between the PCB 704 and the one or more contact points 702.

The operation then proceeds to the process of FIG. 10, wherein at step 1004, the first adhesive surface 604 of the adhesive 602 is adhered on the upper perimeter surface 504 of the ledge 502. At step 1006, the second adhesive surface 606 of the adhesive 602 is adhered on to the bottom perimeter surface 402 of the rim 302 of the component 102. At step 1008, the rim 302 of the component 102 is pressed onto the ledge 502 of the one or more apertures 206 by the external housing 204. The circumference of the external housing 204 applies a pressure over the component 102. The pressure from the external housing 204 hold the component 102 adhered onto the upper perimeter surface 504 of the ledge 502. The external housing 204 ensures that the rim 302 is pressed onto the ledge 502. Thereafter, the method terminates at step 1010.

The arrangements and methods described herein with respect to FIGS. 5-11 enable repeatable factory sealing and seals that cross or leave no parting lines. The sealing system as described above provides a waterproof sealing for the various components within the electronic device 100. Such seals are reliable across a wide temperature range. Such arrangement also enables minimal mechanical area and can maximize internal area for printed circuit boards 704. The internal housing or chassis 202 can be a bolted metal box with compression sealing in the Z-axis whereby the bolts are outside the sealed area and a top external housing 214 with compression sealing in the Y-axis. There are no seals crossing parting lines. In each instance, the internal housing 202 can be covered by an unsealed outer plastic skin or external housing 204 which carries the keypad and side buttons and can serve to protect a user's skin from any hot or warm castings (if any happen to exist in a particular design) and can also serve to retain adhered parts such as side contact header and display lens.

A weldless stamped lens design is highly desirable from a birefringence standpoint. Stamped plastic is desirable because there are no molded-in stresses that can lead to birefringence. Ultrasonic welding is an undesirable manufacturing process which creates stresses in stamped plastic that can lead to birefringence. Furthermore, ultrasonic welding does not make for reliable sealing. Thus, the embodiments using VHB adhesive to seal a stamped lens to a cast internal part can be environmentally sealed. An outer plastic skin such as external housing 204 can serve to retain the adhered display lens 106 or 108 in place (for loading the VHB) which is especially necessary at extreme cold temperatures. This technique can be used both in the display panel 210 as shown in FIG. 8 and the top display aperture 208 as shown in FIG. 9.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A sealing system for sealing a component within an electronic device, the sealing system comprising:
   an internal housing having a ledge and in which one or more apertures are formed, the ledge projecting into one of the one or more apertures perpendicular to a depth of the one of the one or more apertures such that the one of the one or more apertures is at least bisected by the ledge, wherein the internal housing is otherwise sealed;
   an external housing at least partially encapsulating the internal housing, wherein the external housing presses a perimeter of the component onto the ledge; and
   an adhesive disposed between the ledge and the perimeter of the component.

2. A sealing system as claimed in claim 1, wherein the perimeter comprises a top perimeter surface and a bottom perimeter surface, and further wherein adhesive adheres to the bottom perimeter surface and the external housing presses on the top perimeter surface.

3. A sealing system as claimed in claim 1, wherein the component comprises a clear plastic lens, a clear glass lens or a polycarbonate lens.

4. A sealing system as claimed in claim 1, wherein the component comprises a rim extending laterally from a main portion of the component and that is the only portion of the component adhered to the ledge.

5. A sealing system as claimed in claim 1, wherein the external housing surrounds and contacts at least three faces of the internal housing.

6. A sealing system as claimed in claim 1, wherein the component comprises an electrical connector.

7. A sealing system as claimed in claim 6, wherein the electrical connector comprises:
one or more contact points arranged within one or more openings of the electrical connector, wherein the one or more contact points function as electrical connections, wherein the electrical connector is formed from high temperature plastic encapsulating the one or more contact points.

8. A sealing system as claimed in claim 7, wherein the electrical connector further includes:
a printed circuit board, and
further wherein the one or more contact points are electrically coupled to the printed circuit board using high temperature solder connections.

9. A sealing system as claimed in claim 8, wherein the printed circuit board comprises:
a first printed circuit board surface having one or more solder balls arranged in alignment with the one or more contact points of the electrical connector; and
a second printed circuit board surface having a plurality of components and a plurality of connectors, wherein the plurality of components and the plurality of connectors aids in functioning of the electrical connector.

10. A sealing system as claimed in claim 1, wherein the component substantially completely fills all of the one of the one or more apertures in a volume between a plane defined by a surface of the ledge to which the component is adhered and an outer surface of the external housing, the outer surface of the external housing opposing an inner surface of the external housing that faces an outer surface of the internal housing.

11. A sealing system as claimed in claim 1, wherein the component is disposed, in the one of the one or more apertures, only in a volume between a plane defined by a surface of the ledge to which the component is adhered and an outer surface of the external housing, the outer surface of the external housing opposing an inner surface of the external housing that faces an outer surface of the internal housing.

12. A method of sealing a component within an electronic device, the component having a perimeter, the method comprising:
providing an adhesive between the perimeter of the component and a ledge of an internal housing having one or more apertures formed therein, the ledge projecting into one of the one or more apertures perpendicular to a depth of the one of the one or more apertures such that the one of the one or more apertures is at least bisected by the ledge, wherein the internal housing is otherwise sealed; and
pressing the perimeter of the component onto the ledge, with the adhesive therebetween, using an external housing that at least partially encapsulates the internal housing.

13. A method as claimed in claim 12, wherein the perimeter comprises a top perimeter surface and a bottom perimeter surface,
wherein the adhesive adheres to the bottom perimeter surface, and
further wherein the pressing step comprises the external housing pressing on the top perimeter surface.

14. A method as claimed in claim 12, wherein the component comprises a clear plastic lens, a clear glass lens or a polycarbonate lens.

15. A method as claimed in claim 12, wherein the component comprises a rim extending laterally from a main portion of the component and that is the only portion of the component adhered to the ledge.

16. A method as claimed in claim 12, wherein the external housing surrounds and contacts at least three faces of the internal housing.

17. A method as claimed in claim 12, wherein the component comprises an electrical connector, the method further comprising:
forming the electrical connector from high temperature plastic encapsulating one or more contact points arranged within one or more openings of the electrical connector, wherein the one or more contact points function as electrical connections.

18. A method as claimed in claim 17, wherein the electrical connector further includes a printed circuit board, the method further comprising:
electrically coupling the one or more contact points to the printed circuit board using high temperature solder connections.

19. A method as claimed in claim 18, wherein the electrically coupling step comprises:
applying one or more solder balls to a first surface of the printed circuit board;
aligning the one or more solder balls onto the one or more contact points; and
heating the electrical connector, wherein the one or more solder balls reflow onto the one or more contact points.

20. A sealing system for sealing a component within an electronic device, the sealing system comprising:
one or more apertures within an internal housing, wherein the internal housing is otherwise sealed;
an adhesive adhered on a first surface to a ledge of the one or more apertures and adhered on a second surface to a perimeter of the component; and
an external housing, wherein the external housing presses the perimeter of the component onto the ledge of the one or more apertures,
wherein the component comprises a clear plastic lens, a clear glass lens or a polycarbonate lens.

* * * * *